US009875835B2

(12) United States Patent
Gillingham et al.

(10) Patent No.: US 9,875,835 B2
(45) Date of Patent: Jan. 23, 2018

(54) OPTICAL TELESCOPE FIBRE POSITIONING DEVICES

(71) Applicant: Commonwealth of Australia as represented by Department of Industry, Canberra (AU)

(72) Inventors: Peter Gillingham, Canberra (AU); Will Saunders, Canberra (AU); James Gilbert, Canberra (AU); Gregory Smith, Canberra (AU); Nicholas Staszak, Canberra (AU); Jerzy Brzeski, Canberra (AU); Stanislaw Miziarski, Canberra (AU); Scot Smedley, Canberra (AU); Tony Farrell, Canberra (AU); Lewis Waller, Canberra (AU)

(73) Assignee: Commonwealth of Australia as represented by Department of Industry, Canberra (AU)

( * ) Notice: Subject to any disclaimer, the term of this patent is extended or adjusted under 35 U.S.C. 154(b) by 325 days.

(21) Appl. No.: 14/287,399

(22) Filed: May 27, 2014

(65) Prior Publication Data

US 2015/0077846 A1    Mar. 19, 2015

(30) Foreign Application Priority Data

May 28, 2013   (AU) ................................ 2013206059

(51) Int. Cl.
*G02B 6/36*    (2006.01)
*G02B 23/16*   (2006.01)
(Continued)

(52) U.S. Cl.
CPC ............. *H01F 7/0252* (2013.01); *G02B 6/06* (2013.01); *G02B 6/3616* (2013.01); *G02B 23/16* (2013.01);
(Continued)

(58) Field of Classification Search
CPC ........ H01F 7/00; H01F 7/0231; H01F 7/0252; H01L 41/00; H01L 41/02; H01L 41/04; H01L 41/042; H01L 41/053; H01L 41/06; H01L 41/08; H01L 41/09; H01L 41/0906; H01L 41/092; H01L 41/0926;
(Continued)

(56) References Cited

U.S. PATENT DOCUMENTS 3,497,696 A * 2/1970 Rosin ..................... G01S 3/789
                                                      250/203.6
5,062,150 A * 10/1991 Swanson ............... H04B 10/118
                                                      250/203.1
(Continued)

OTHER PUBLICATIONS

Saunders et al., "MOHAWK A 4000 fiber positioner for DESpec" presentation presented at the AAO KICP Dark Energy workshop on May 31, 2012.*
(Continued)

*Primary Examiner* — Derek S Chapel
(74) *Attorney, Agent, or Firm* — Seyfarth Shaw LLP

(57) ABSTRACT

A positioning system comprising a mounting assembly arranged to move a positioning device via a magnetic coupling interaction between the mounting assembly and the positioning device. The positioning device is configured to limit the spread of flux away from the device.

14 Claims, 20 Drawing Sheets

(51) Int. Cl.
  *H01F 7/02* (2006.01)
  *G02B 6/06* (2006.01)
  *H01L 41/09* (2006.01)
  *G02B 6/35* (2006.01)
  *G02B 23/02* (2006.01)

(52) U.S. Cl.
  CPC ............ *H01L 41/09* (2013.01); *G02B 6/3504* (2013.01); *G02B 6/3624* (2013.01); *G02B 23/02* (2013.01); *Y10T 307/76* (2015.04)

(58) Field of Classification Search
  CPC ... H01L 41/31; Y10T 307/74; Y10T 307/747; Y10T 307/76; G02B 23/00; G02B 6/3504; G02B 6/35–6/3508; G02B 6/3604; G02B 6/3616; G02B 6/3624
  USPC ............ 359/196.1–199.3, 200.6–200.7, 399; 385/12–13, 25, 39–42, 76–77, 78, 82, 84, 385/88–90, 120, 134, 136–137; 250/200, 250/201.1, 203.1, 203.3–203.4, 216, 250/227.11
  See application file for complete search history.

(56) References Cited

U.S. PATENT DOCUMENTS

| | | | | |
|---|---|---|---|---|
| 5,602,948 | A * | 2/1997 | Currie | B60Q 7/00 362/554 |
| 7,460,758 | B2 * | 12/2008 | Xin | G02B 6/4452 385/134 |
| 2004/0042716 | A1 * | 3/2004 | Dames | G02B 6/32 385/31 |
| 2004/0195939 | A1 | 10/2004 | Noda | |
| 2008/0131048 | A1 * | 6/2008 | Yoo | G02B 6/3502 385/6 |

OTHER PUBLICATIONS

Saunders et al., "MOHAWK A proposed fiber positioner for MS-DESI" presentation presented at the AAO MS-DESI meeting on Mar. 5, 2013.*
Partial European Search Report, dated Oct. 8, 2014; 7 pages.
Extended European Search Report, dated Jan. 26, 2015; 9 pages.
Saunders, Will et al., 'MOHAWK' : a 4000-fiber positioner for DESpec; Proc. of SPIE, vol. 8446, 2012; pp. 1-10.

* cited by examiner

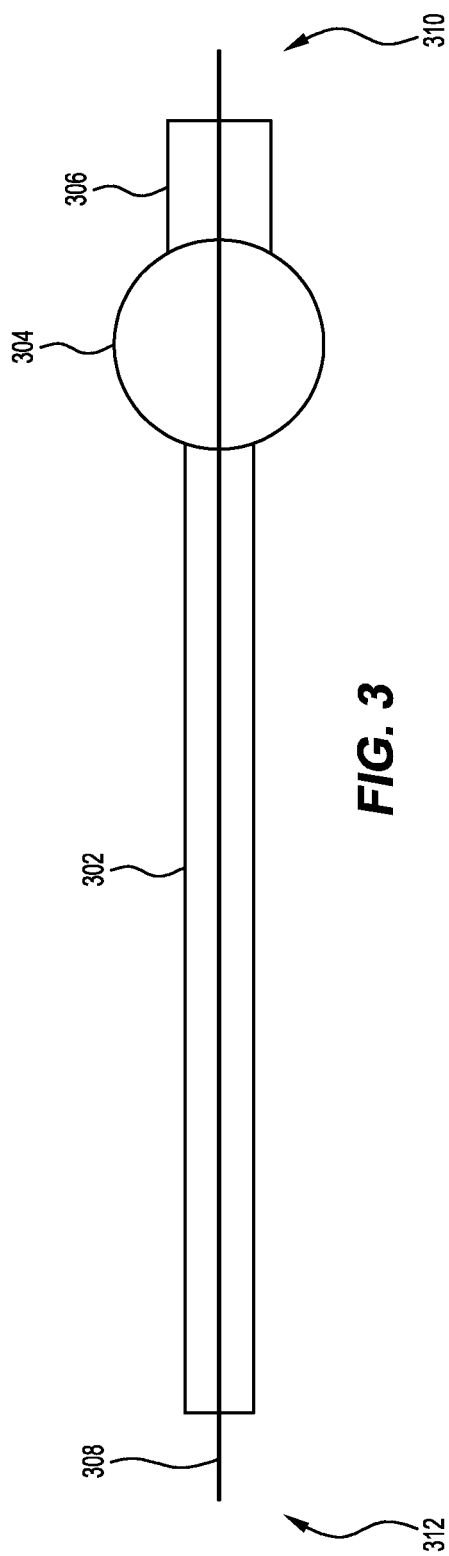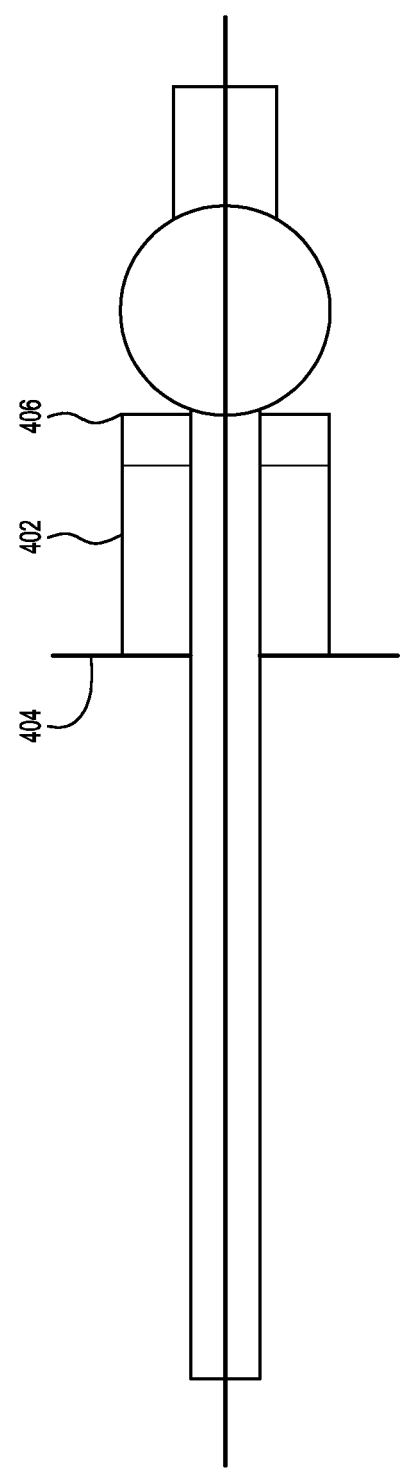

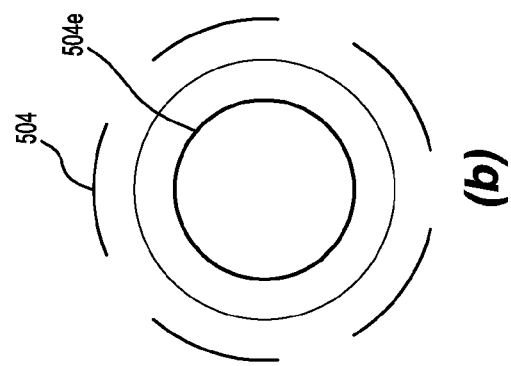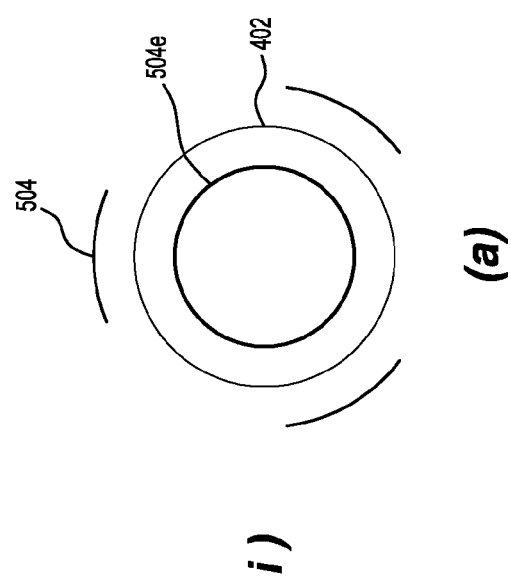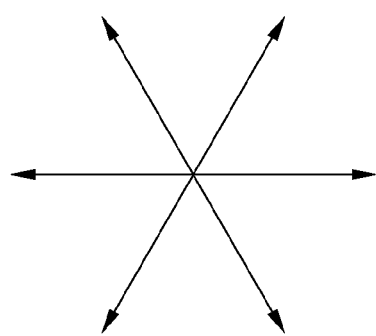
FIG. 8

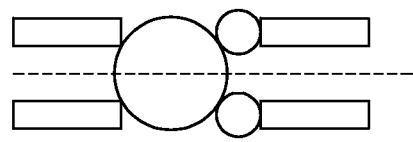
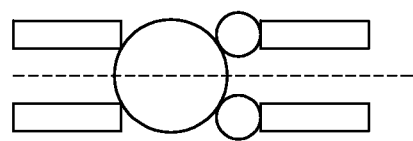
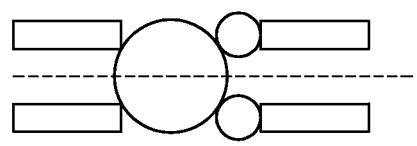
FIG. 10

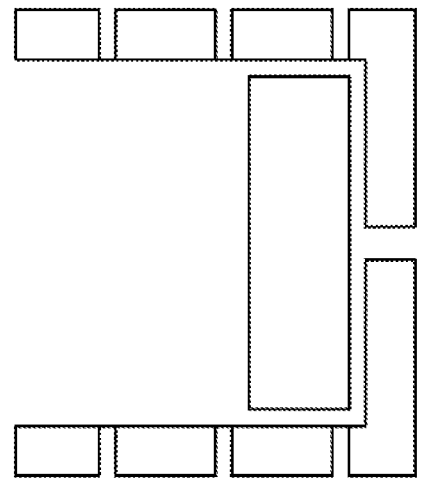
FIG. 19
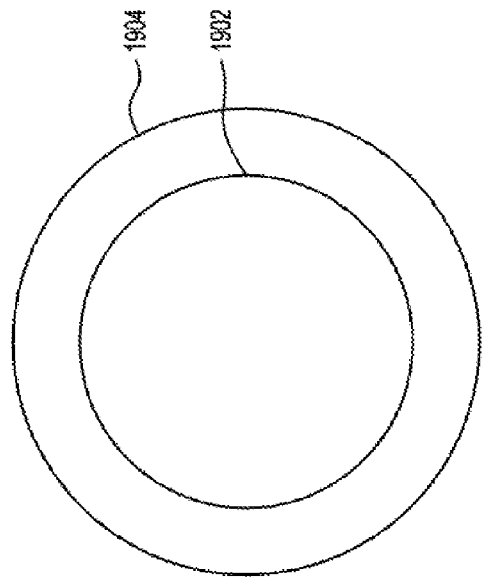
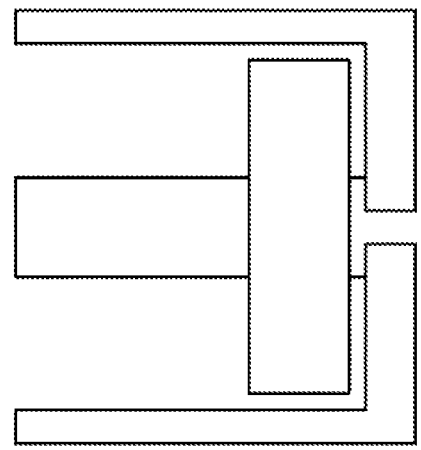
FIG. 18
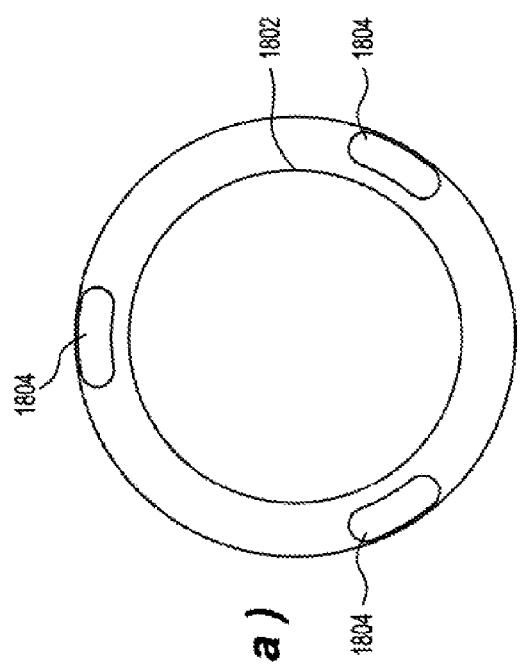

OPTICAL TELESCOPE FIBRE POSITIONING DEVICES

FIELD OF THE INVENTION

The present invention relates to a positioning device and, in particular, positioning device for positioning optical fibres in a telescope.

BACKGROUND OF THE INVENTION

Large optical telescopes are used to view astronomical objects such as stars and galaxies. Such telescopes collect data for measurement and scientific analysis. A representation of an optical telescope is shown in FIG. 1. Light from the stars, or other astronomical objects, 100 is reflected by a mirror 102 in the telescope onto the focal surface of the telescope 104. The light received at the focal surface is captured by optical fibres and fed to a spectrograph 106 for analysis. In large optical telescopes several hundred optical fibres are used to capture the light.

The spectrum of light emitted by astronomical objects provides information about many attributes of the object, including composition, age, position in its life time and movement of the object relative to the earth. The more light that is captured from a particular object, the more efficiently information can be determined about that object. Optical spectrum analysis can be complicated and hindered by light from other sources and so, in order to analyse the spectrum of an object most reliably and efficiently, the optical fibres used for collection of the light should be physically aligned with the incoming light as accurately as possible. This requires significant precision control when positioning the optical fibres.

Additionally, due to the constant rotation of the earth, the position of a particular object in the sky will vary over time. In order to remain aligned with incoming light from an object, large optical telescopes require the ability to reposition the light capturing optical fibres accurately and efficiently.

In typical large optical telescope systems, the mirrors used to capture and reflect the light have a diameter of several meters. These mirrors reflect the light onto a focal surface of around 0.5 meters diameter or more. The typical cross section diameter of a light capturing optical fibre is around 100 micrometers and the positional accuracy required in order to collect the light for analysis is single micrometers.

FIG. 2 is a representation of a plate of optical fibres for capturing light in a large optical telescope. The plate 200 includes around 3000 optical fibres 204. Each optical fibre is contained within a separate tube 202 for support and positioning. For many astronomical research programs using optical telescopes, the position of each optical fibre should be controlled independently and be able to move independently of all other fibres. In some systems, the positioning of each optical fibre is controlled by independent piezoelectric actuators associated with each optical fibre.

There are many design considerations when designing systems to position large numbers of optical fibres. One challenge is the close proximity of the fibres and their actuator units, specifically that the position of each fibre must not be affected by movement of adjacent fibres or actuators. This is important, in particular due to the required positional accuracy of within a few micrometers. A further challenge lies in controlling the movement of all fibres simultaneously, so that all fibres can be positioned reliably and accurately in short time frames. The minimum achievable precision is a particular challenge due to the long length of the fibre compared with the positional accuracy requirements (a few micrometers) on that fibre. For a 'tilting spine' design as shown in FIG. 2, the supporting tubes must be long to reduce the tilt of the fibre tip when each fibre is moved to the limits of its positioning range.

In certain fibre positioning systems in optical telescopes, each individual fibre is positioned via a magnetic interaction with a magnetic mount. This large number of magnetic materials in such a confined space generates complicated magnetic field patterns.

In certain systems, piezo electric actuators are used to control the positioning. Typically, the actuators require electric potentials of hundreds of volts to produce deformation of the material. With each piezoelectric actuator being driven independently, this creates significant considerations for electrical connections to those crystals in such confined locations.

Embodiments of the present address these problems.

SUMMARY OF THE INVENTION

In a first aspect, the present invention provides a positioning system, comprising a mounting assembly arranged to move a positioning device via a magnetic coupling interaction between the mounting assembly and the positioning system, and wherein the positioning device is configured to limit the spread of flux away from the device In an embodiment the positioning device controls the position of an optical fibre.

In an embodiment the mounting assembly comprises a magnetic flux guide including a magnet, the magnetic flux guide being configured to guide the magnetic flux between the magnet and the positioning device.

In an embodiment the magnetic flux guide is of ferrous material.

In an embodiment, the magnetic flux guide is cup shaped.

In an embodiment, the magnetic flux guide is in contact with the positioning device.

In an embodiment, the mounting assembly further comprises a support structure for contacting the positioning device.

In an embodiment, the support structure is a jewel bearing.

In an embodiment, the support structure comprises multiple contact elements.

In an embodiment, the mounting assembly is moved by a piezo electric actuator.

In a second aspect, the present invention provides an impulsively actuated positioning system comprising the positioning device of the first aspect.

In a third aspect, the present invention provides a sensor array for an optical telescope comprising a plurality of the positioning devices of the first aspect wherein the positioning devices are configured adjacent to one another and the magnetic flux of each device is limited to limit interference with adjacent devices.

In an embodiment further comprising an optical fibre support tube, the positioning device being moved at regular time intervals and wherein the frequency of movement of the positioning device matches a resonant frequency of optical fibre support tube.

In a fourth aspect, the present invention provides an electrical circuit for controlling a switching system, comprises a plurality of switches, each switch being configured to apply a selected electrical signal to an actuator, a processor for determining how many electrical signals should be applied to each actuator and a control means for controlling the electrical signals and for counting the number of electrical signals applied to each actuator and for controlling the configuration of the plurality of switches to deliver the determined number of electrical signals.

In a fifth aspect, the present invention provides a method for controlling a switching system, the switching system including a plurality of switches, the switches being configured to deliver electrical signals to an actuator, comprising the steps of: determining a number of electrical signals to be delivered to each actuator, counting the number of electrical signals delivered to each actuator, determining whether additional electrical signals should be delivered to the actuator and controlling the configuration of the switch in dependence on whether further electrical signals should be delivered.

In an embodiment, the step of determining the polarity of the number of electrical signals delivered to each actuator.

In an embodiment, the electrical signals are voltage pulses at a predefined frequency.

In an embodiment, the present invention provides a method for controlling a positioning system in an optical telescope comprising the steps of the fifth aspect.

In a further aspect, a tube for supporting an optical fibre in a fibre positioning system for use in an optical telescope, wherein the tube is comprised of a pultruded carbon fibre tube.

In an embodiment, the pultruded carbon fibre has high modulus.

BRIEF DESCRIPTION OF THE DRAWINGS

Features and advantages of the present invention will become apparent from the following description of the various embodiments, by way of example only, with reference to the accompanying drawings, in which:

FIG. 3 is an illustration of a spine assembly including the optical fibre;

FIG. 4 is an illustration of the spine assembly including the actuator;

FIG. 8 shows further embodiments of the piezoelectric actuator;

FIG. 10 shows various spine assemblies;

FIG. 18 shows a mounting assembly;

FIG. 19 shows a further mounting assembly;

DETAILED DESCRIPTION OF THE EMBODIMENTS

Figure 1:
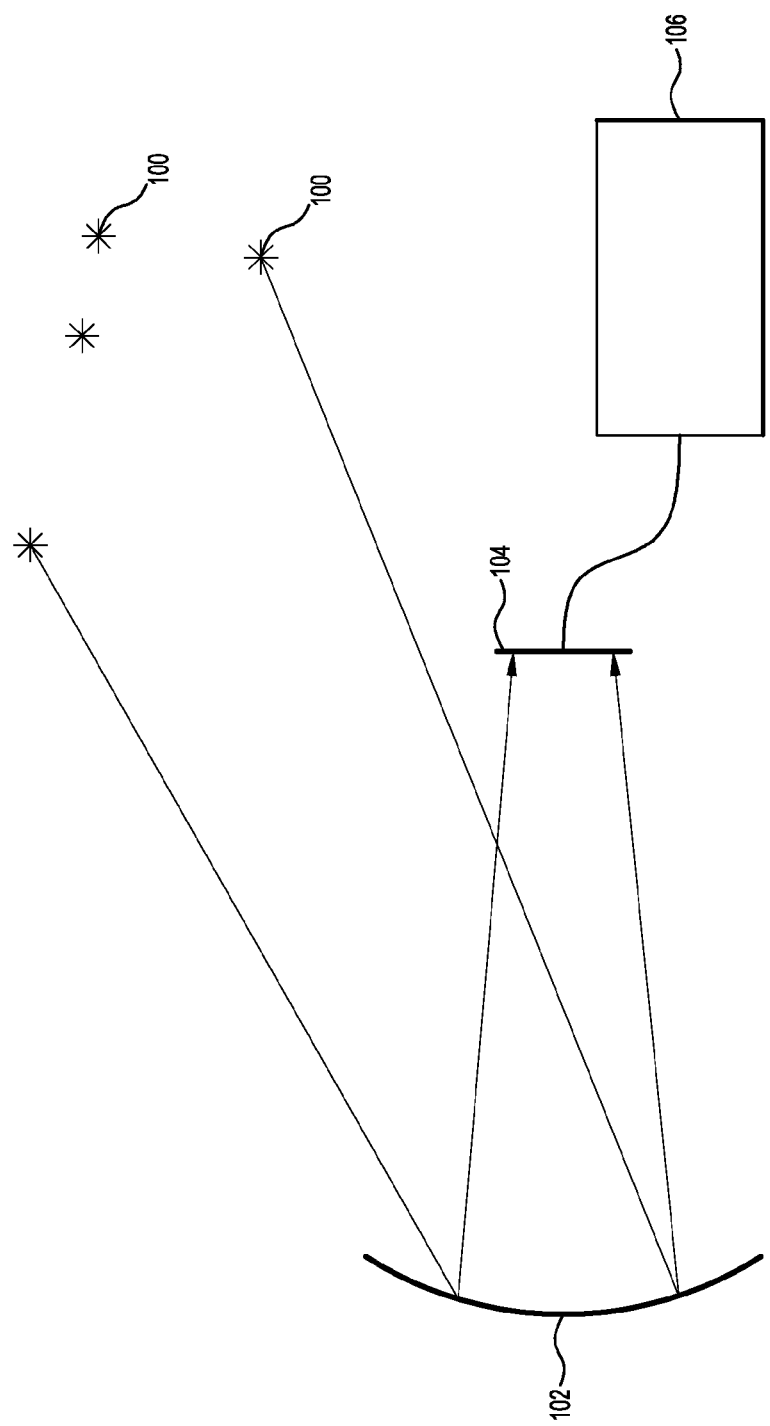
FIG. 1 is a representation of an optical telescope.
Figure 2:
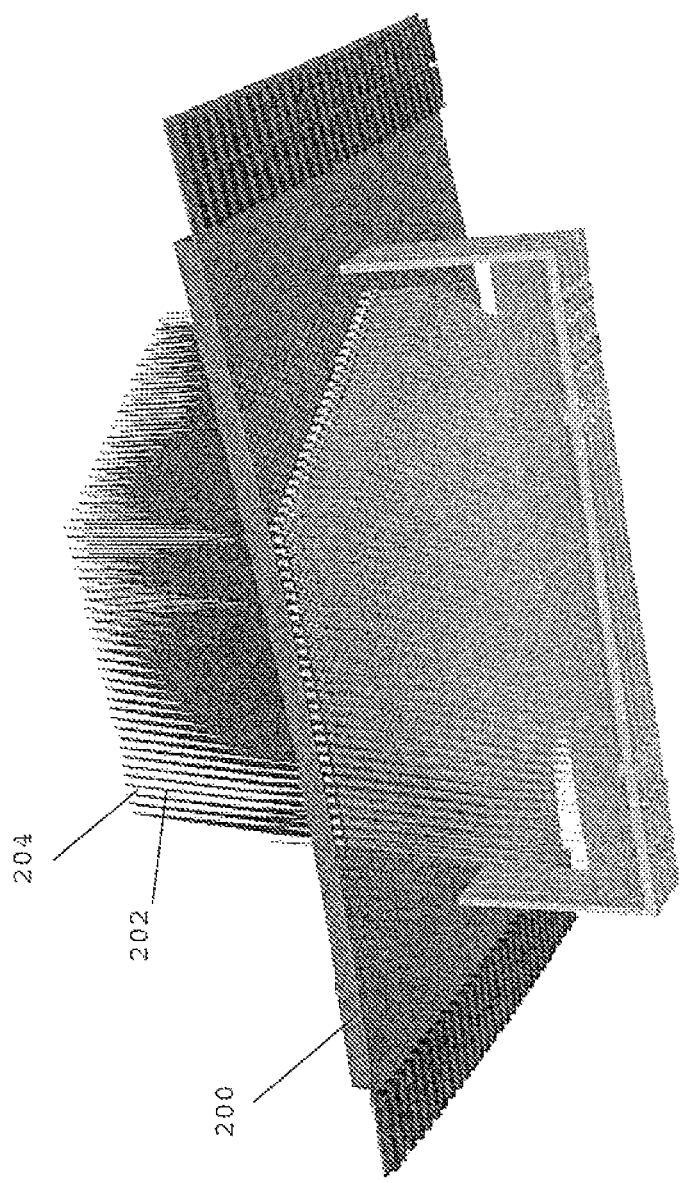
FIG. 2 is a representation of a plate including over three thousand optical fibres for use within an optical telescope.

FIG. 3 is an illustration of a spine assembly in an embodiment of the invention. The spine comprises a carbon fibre tube. The carbon fibre tube is made from pultruded carbon fibre. Such pultruded tubes are composed of very straight and aligned carbon fibres in a plastic matrix. The fibres are aligned along the length of the tube to provide improved stiffness.

The tube is of order 250 mm in length and 2 mm in diameter. Further embodiments have different dimensions, for example 200 m in length and 1.5 mm in diameter. The tube is connected to a pivot ball 304 and the tube and ball are coupled together to prevent any relevant movement between the ball and the tube. The ball is made from any ferromagnetic material. The ball is further connected to a counterweight 306. The tube, ball and counterweight are configured to allow an optical fibre 308 to pass through the spine. The end of the fibre protruding from the open end of the tube 312 captures light and the end protruding from the counterweight 310 is connected to the spectroscope to provide light for analysis.

The position of the spine, and therefore the fibre, is controlled by an actuator assembly as shown in FIG. 4. The actuator assembly is driven by a piezoelectric actuator tube 402. The piezoelectric actuator tube 402 is anchored at one end 404, typically to a plate on the telescope, and the other end is connected to a magnetic mounting assembly 406. The actuator assembly is hollow and the tube of the spine assembly is located within the bore of the actuator assembly.

The magnetic mounting assembly creates an attractive force which maintains contact between the mounting assembly and the pivoting ball while allowing relative rotation between the actuator assembly and the spine.

Figure 5:
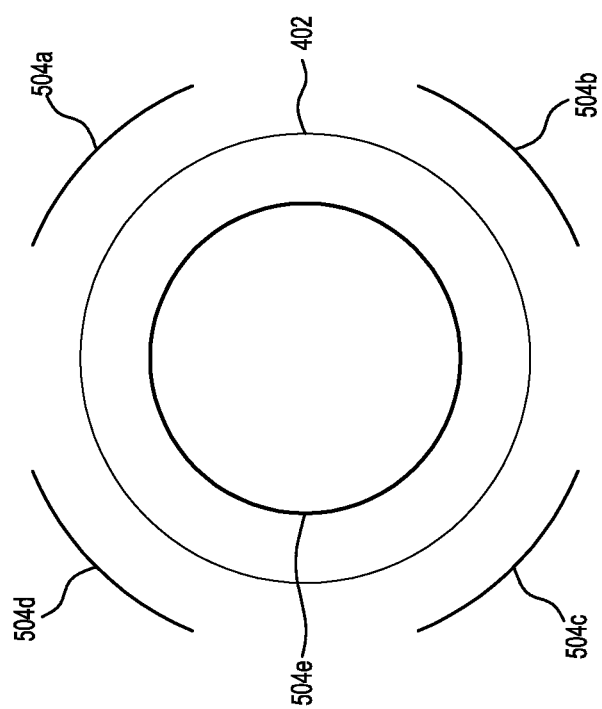
FIG. 5 is a cross section or representation of a piezoelectric actuator having multiple electrodes.

Movement of the actuator assembly is driven by deformation of the piezoelectric tube 402. The piezoelectric tube 402 is cylindrical in shape and includes four electrodes 504a-d attached around its perimeter, each electrode being connected independently of one another, as shown in FIG. 5. A fifth cylindrical electrode 504e is deposited on the inner surface of the piezoelectric tube. This electrode may or may not be electrically connected to the control system.

Application of an electrical potential to the electrodes results in application of electric fields to the piezoelectric tube, which results in distortion of the material. The piezoelectric tubes are polarized during manufacture, to create their piezo properties.

Usually the direction of polarization is from the inside of the tube to the outside, across the wall. When an electric field having the same polarity and orientation as the original polarization field is placed across the tube wall (i.e. negative voltage applied to outside of tube), the thickness of the wall increases. This in turn makes the length of the tube reduce. So, in the example of FIG. 6, when a negative potential is applied to the right hand side of a tube and a positive is applied to the left hand side, then the right side will shrink, the left side will lengthen, and consequently the tube will 'bend' over to the right.

By using these properties of the piezoelectric tube, the system is able to control distortion of the tubes and, therefore, the movement of the spines coupled to the tubes. Application of a positive potential to an electrode on the outside of the tube causes the tube to lengthen in the region of that electrode and application of a negative potential to an electrode on the tube causes the tube to shorten in the region of the electrode. Controlled distortion of the tube can is created by applying various potentials across the electrodes of the tube as shown in FIG. 6.

Figure 6:
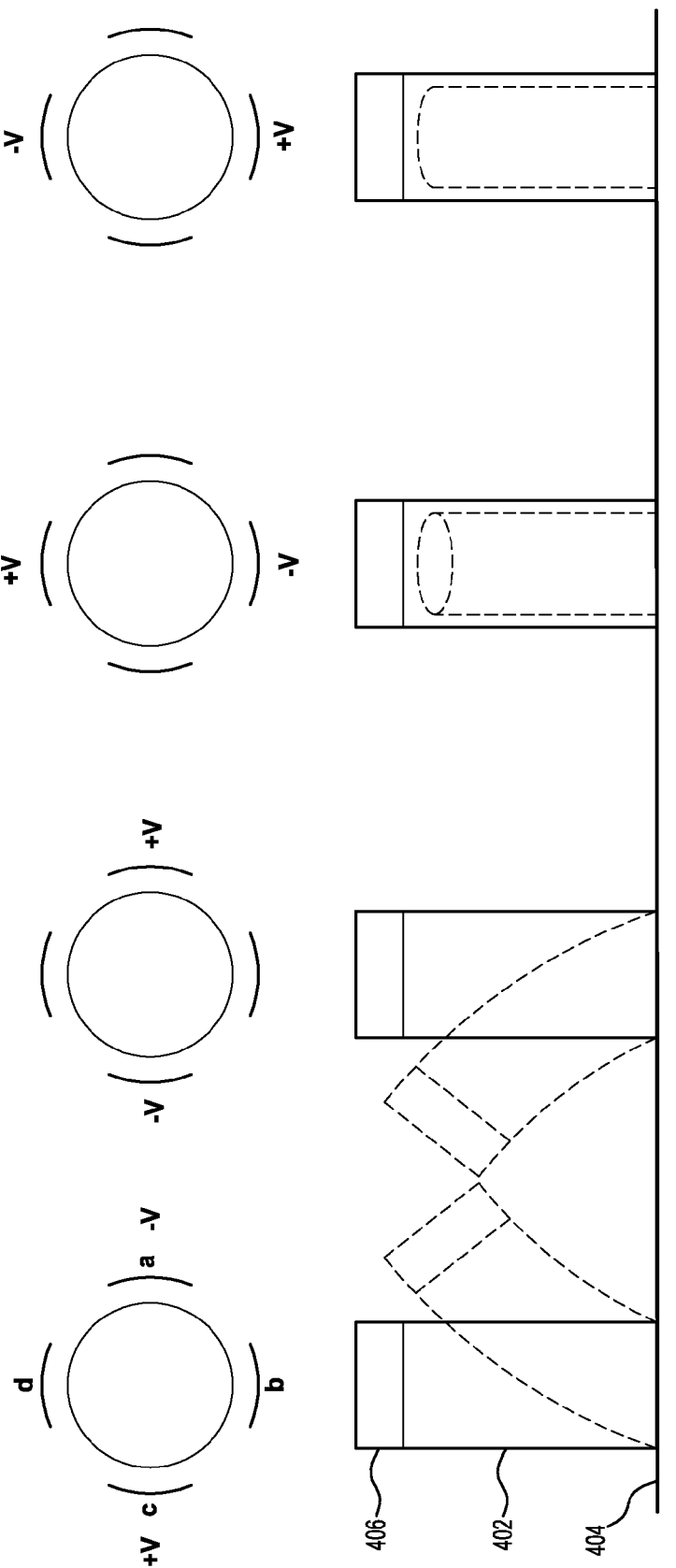
FIG. 6 shows the distortion of the piezoelectric ceramic under various voltage configurations across the electrodes.

FIG. 6 shows a cross sectional representation of the piezoelectric tube 402 indicating the electrodes to which various voltages are applied and a corresponding side view of the tubes showing the distortion resulting from the application of the potential. In each case, the piezoelectric tubes are securely coupled to a plate 404 and the opposite end of the tube is coupled to magnetic mounting assembly 406.

In FIG. 6a a positive voltage is applied to electrode C and a negative voltage is applied to the opposite electrode A. The central electrode is grounded at zero volts.

Electrodes B and D are unconnected in this configuration. The positive voltage applied to electrode C produces an increase in the tube's length, and the negative voltage applied to electrode A produces a shortening of the tube's length. Consequently, the piezoelectric tube is distorted and a bending effect is created towards electrode A. This distortion creates a change in angle of the magnetic cup 406 with respect to the plate 404.

In FIG. 6b the voltage across electrodes A and C is reversed in order that a negative voltage is placed on electrode C and a positive voltage is placed on electrode A. Again, electrodes D and B are unconnected. In this configuration, a bending of the piezoelectric tube is produced in the direction of electrode C due to the positive voltage on electrode A producing a lengthening of the piezoelectric tube in the region of electrode A and a shortening of the piezoelectric material in the region of electrode C. In this configuration, the angle of the mounting assembly is changed with respect to the plate 404 but in the opposite direction from the configuration in FIG. 6a.

In FIG. 6c a positive voltage is applied to electrode D and a negative voltage is applied to electrode B. Electrodes A and C are unconnected. In this configuration the piezoelectric tube bends towards electrode B and this is represented by the piezoelectric material bending into the page.

Finally, in FIG. 6d a positive voltage is applied to electrode B and a negative voltage is applied to electrode D with electrodes A and C unconnected. This voltage configuration results in the piezoelectric tube bending out of the page towards electrode D.

In each of the examples provided in FIG. 6, when the voltage across the electrodes is reduced to zero the actuator will snap back into its original, undistorted cylindrical configuration since it matches that on the central electrode. The piezoelectric tube acts in an elastic manner. This return to its original configuration is reproducible over thousands of cycles.

The response time of the piezoelectric tube is relatively immediate on application or removal of a voltage to an electrode when the central electrode 504e is connected to ground. Consequently, it is possible to distort the ceramic and snap it back to its original position many times a second by applying a suitably shaped pulsed voltage, for example in the form of a sawtooth voltage application.

In the event that the central electrode is not grounded, the tube will return to its original shape more slowly.

The skilled person will appreciate that there are many configurations of piezoelectric tubes and electrode configurations which can be used to generate controlled distortion of a piezoelectric tube. If the piezo electric tube is polarized in the opposite direction if displacement directions are reversed relative to the potential applied to the same electrodes, i.e. a positive potential produces a contraction in the material and a negative potential produces an expansion. Additionally, by varying the position and number of electrodes applied to a piezoelectric material, different distortion configurations are possible. Further embodiments of the invention may use different materials and electrode configurations. As long as the distortion is controlled then the configuration can be useful in the fibre positioning system.

FIG. 8 a(i) shows a cross section of a piezoelectric tube 402 having three equally spaced external electrodes 504 and a single cylindrical central electrode 504e. Various configurations of voltage across the electrodes will produce distortion of the tube in different directions as indicated in FIG. 8 a((i).

FIG. 8b shows a further piezoelectric tube having five equally spaced electrodes around its perimeter and a simple central cylindrical electrode 504e.

The skilled person will recognise that any combination of electrode location and voltage can be applied to a piezoelectric tube to produce distortion of the tube in a particular required direction.

The extent of distortion of the piezoelectric tube can be varied by varying the magnitude of the potential applied.

Figure 7:
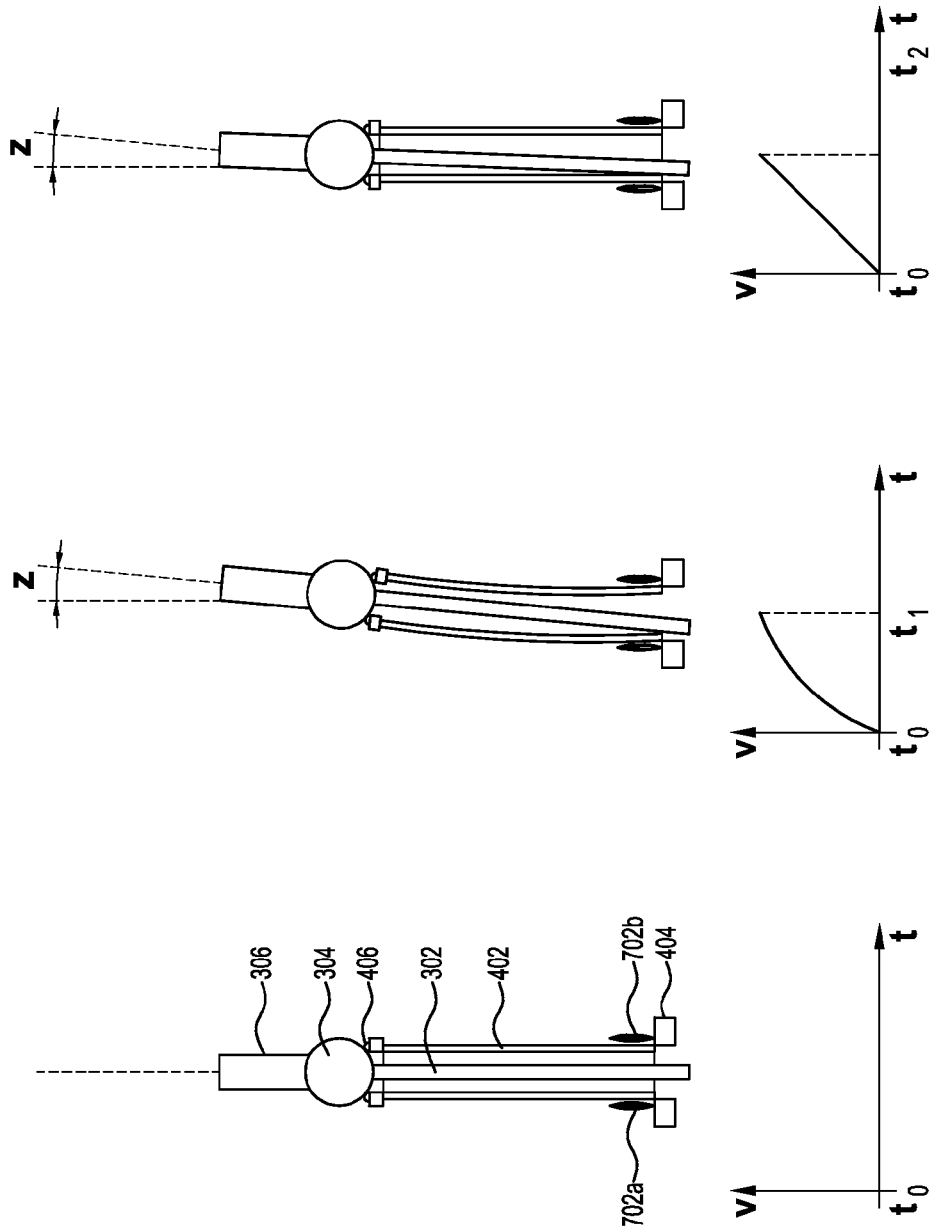
FIG. 7 shows movement of the spine assembly produced by the piezoelectric actuator.

Embodiments of the invention take advantage of the repeatable and calibratable properties of the piezoelectric tube to drive movement of the optical fibre when the spine assembly is magnetically attached to the actuator assembly. This is demonstrated in FIG. 7. FIG. 7 shows the spine assembly including the carbon fibre tube 302, pivoting ball 304 and counterweight 306 in position with the piezoelectric tube 402 and a magnetic mounting assembly 406. The piezoelectric tube is connected to the base plate 404. A pair of electrodes 702 a and b are connected to opposite external sides of the piezoelectric tube. The spine assembly is held in place by the magnetic attraction between the pivoting ball 304 and the magnetic mounting assembly 406.

In FIG. 7a, at time t0, no voltage is applied across any plate of the piezoelectric tube and so the tube retains its cylindrical configuration and is not distorted.

In FIG. 7b, at t1, a voltage is applied across the electrodes of the piezoelectric tube. A positive voltage is applied to electrode 702a and a negative voltage is applied to electrode 702b. On application of the voltage the piezoelectric tube is distorted and bends towards the negative voltage. The magnetic attraction between the spine assembly and the piezoelectric tube produced by the magnetic mount on the pivoting ball produces movement of the spine assembly. In this case the pivoting ball follows the movement of the mount at the end of the piezoelectric tube and the position of the spine tip is offset with respect to the cylinder.

At t2 the voltage on the electrodes of the piezoelectric tube is suddenly reduced to zero, and the actuator immediately snaps back to its original cylindrical configuration.

Although there is a magnetic coupling interaction between the spine assembly and the mounting assembly, the components are not physically coupled together. Consequently, the force on the spine assembly from the actuator is a consequence of the magnetic attractive force and the coefficient of friction between the ball and the mount. The immediate snapping back motion of the piezoelectric results in the magnetic mount moving at very high speeds, even though the distance moved is very small. This large acceleration results in the ball slipping with respect to the mount. The consequence of this is that when the piezoelectric actuator snaps back to its cylindrical configuration the pivoting ball slips with respect to the cup and so retains its angular orientation. This is shown in FIG. 7c and represented by angle z. Since the spine assembly is balanced it retains angular orientation z with respect to the axis of the piezoelectric tube.

On the next voltage cycle applied to the piezoelectric tube the spine assembly is again moved with the distortion of the piezoelectric actuator resulting in further movement of the optical fibre. Again, when the voltage is suddenly reduced to zero the immediate response of the piezoelectric tube snapping back to its undistorted configuration is fast enough to result in no rotation of the spine assembly. This manner of driving movement of the spine assembly is known as "stick and slip motion".

The purpose of the counterweight is to ensure that the centre of mass of the spine assembly, comprising the spine tube, ball, and counterweight, is located at the centre of the ball, and to increase the mass moment of inertia of the spine assembly, thus increasing its resistance to rotation when the actuator tube snaps back at time t1.

Since the displacement of the piezoelectric is reproducible for given voltage, the number of voltage cycles required to move the spine assembly a predefined distance can be calculated.

In typical configurations a voltage of order 100 volts will produce movement of the top of the spine assembly of order 10 micrometers.

The electrodes of each piezoelectric actuator for every spine are connected to a power supply generating voltage pulses at a frequency of around 100 Hz. At set up, the system calculates the current position of each optical fibre on the focal surface and determines what displacement of that optical fibre is required in order that it is located accurately in order to be directed at the required star. In certain systems, this identification process is performed by a camera photographing the position of each optical fibre and determining required displacement for each fibre to reach its required location although other location recognition methods may be used. The system then determines how many movement cycles of each piezoelectric tube will be required to drive the associated spine to correctly position the optical fibre, and in which direction or combination of directions. These calculations are performed for each and every fibre in the telescope. However, in further embodiments, depending on the data required, some or all optical fibres may be required to be used during a particular analysis.

Figure 9:
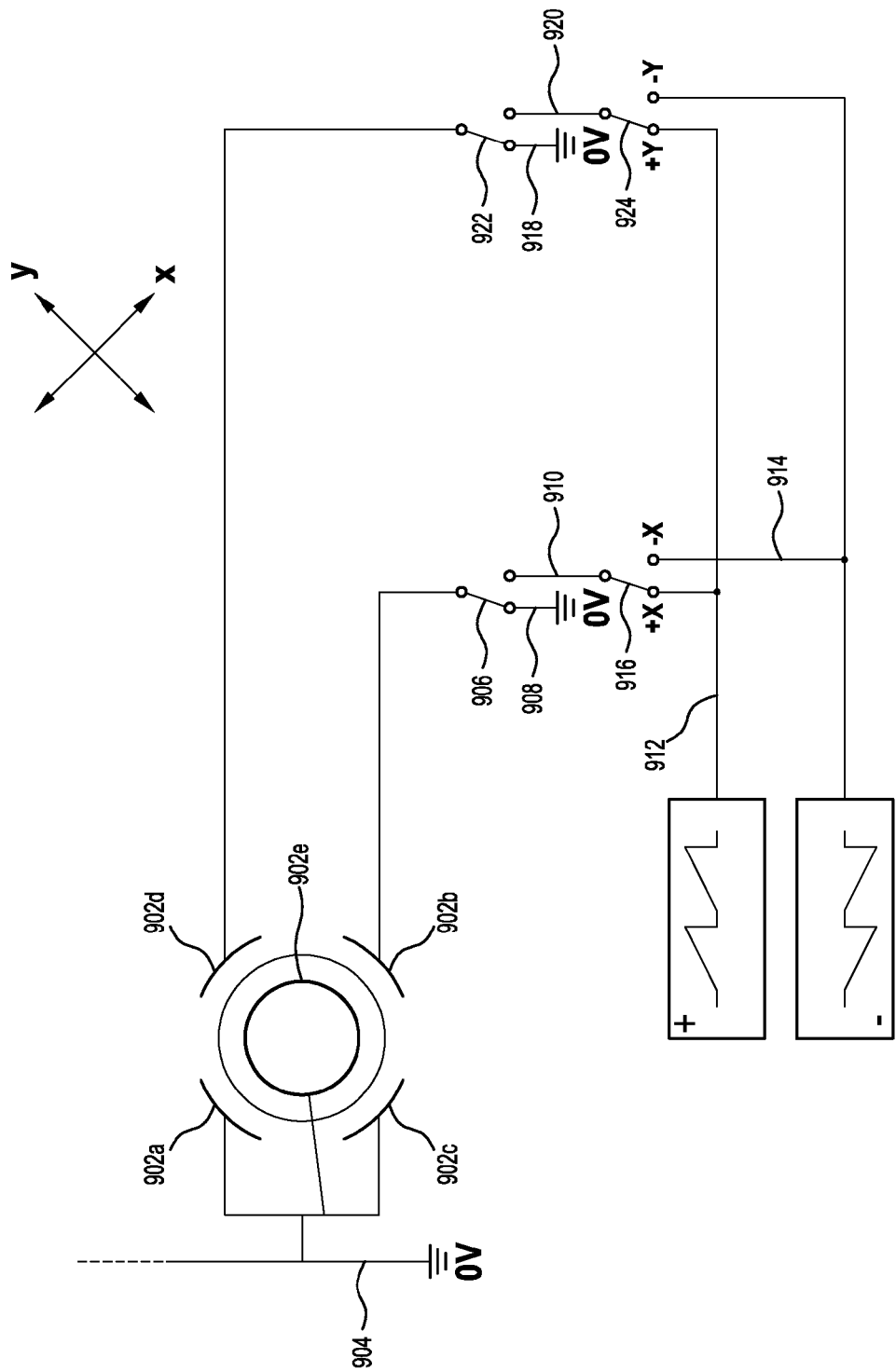
FIG. 9 is a circuit diagram showing switching configuration of piezoelectric actuators.

FIG. 9 shows the electrical switching configuration in an embodiment of the invention. This configuration includes a piezoelectric having four equally spaced electrodes 902a-d. Two adjacent external electrodes (902a and 902c) are connected to ground and the remaining two external electrodes (902b and 902d) can be connected to positive or negative potential or ground, depending on the switching configuration. In further embodiments, all external electrodes could be connected to power supplies or some could be connected to power supplies. The benefit of connecting one of each pair of electrodes to ground is to reduce the number of switches in the system while maintaining the four directions of motion. The central electrode 902e is connected to ground.

FIG. 9 shows an embodiment including two opposite pairs of electrodes attached to a piezoelectric tube, namely a first pair 902a and b and a second pair 902c and d. Electrode 902a is connected to ground (zero volts) 904. The electrode on the opposite side of the tube, 902b, is connected to a first switch 906 which has two switching configurations, a first configuration in which it is connected to ground at 908 and a second configuration in which it is connected to an active voltage at 910. The active voltage 910 can be made positive at 912 or negative 914 using a further switch 916 and depending on the configuration of switch 916.

In the embodiment of FIG. 9, the piezoelectric actuator can be displaced towards or away from electrode 902b by applying a negative or positive voltage respectively to electrode 902b. For the second pair of electrodes, 902c and 902d, 902c is connected to ground 904 and 902d is connected to either ground 918 or an active voltage 920 via switch 922. Switch 924 determines whether the active voltage 920 is made positive or negative depending on the switching configuration.

When the system is operating using a high frequency sawtooth voltage, timely control of the switches becomes important. In a telescope system, as discussed above, different fibres will be required to move different distances in order to be correctly aligned with their allocated light sources. Consequently, the actuators for different spines will be required to drive their spine assemblies different distances to reach the correct location. This requires the electronics of the telescope system to be able to control when different electrodes are active and inactive within the sequence of the sawtooth voltage pulses in order that each actuator is activated the correct number of times.

FIG. 10 shows three adjacent spines each of which is required to be displaced a different distance. Assembly A requires 100 pulses, assembly B requires 120 pulses and assembly C require 157 pulses.

Figure 11:
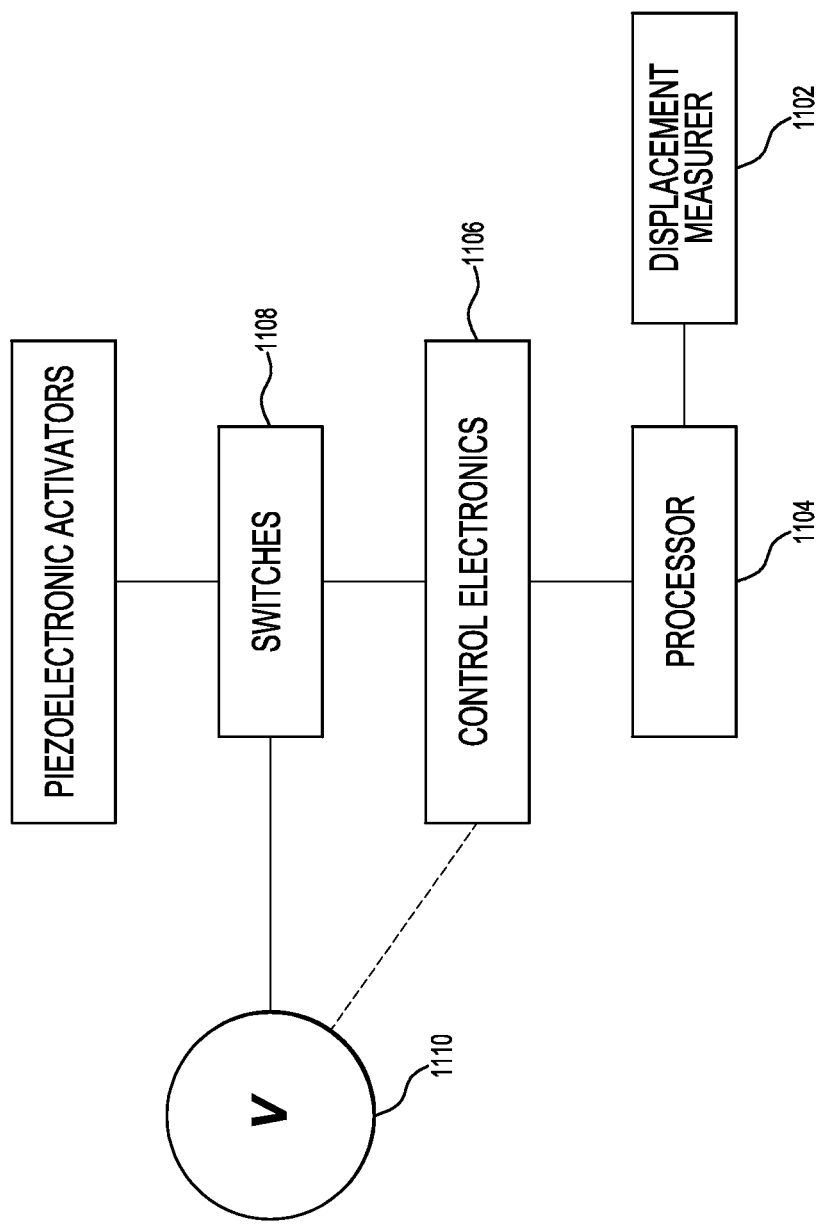
FIG. 11 is a block diagram showing hardware used to drive an embodiment.

FIG. 11 shows the control electronics for driving the actuators of the positioning system. The system includes a displacement measurer 1102 which determines the location of each of the optical fibres and determines the required displacement of each optical fibre in order to reach its required position. The processor 1104 determines the number of pulses required for each optical fibre in order to arrive at the correct location. The processor also determines the voltage configuration for each actuator in order to drive each spine in the correct direction. In order to complete this step the processor will account for the distance moved by each fibre during each actuation pulse.

Figure 12:
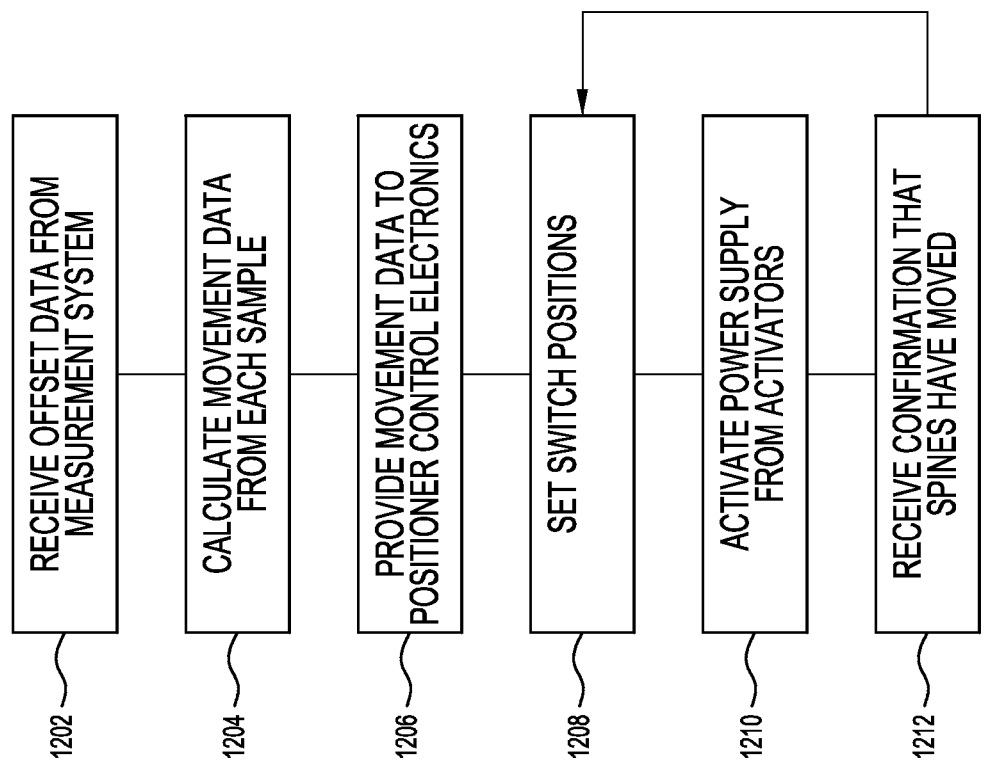
FIG. 12 is a flow diagram showing steps taken in positioning fibres in the system.

The number of voltage pulses and direction of motion is provided to the control electronics 1106 at step 1206 of FIG. 12. The control electronics is responsible for management of the switch configuration and also for determining that switches are correctly configured before any voltage is applied. The control electronics has control of each switch and also has control of the power supply 1110. The control electronics includes a counter for each individual spine.

In an example and referring to FIGS. 10 and 12, the control electronics will manage the displacement of actuator and spine combinations 10a, 10b and 10c. Combination A requires 100 pulses and a particular voltage configuration in order to move the fibre in the correct direction. Combination B requires 120 pulses at a particular voltage configuration. Combination C requires 157 pulses at a particular voltage configuration. Before applying the voltage, the control electronics determines the required switching configuration for each actuator and instructs each switch to move to its necessary connection position at 1208. The control electronics activates the power source at 1212. In some embodiments, the central electronics which to receive confirmation that the switches are in correct position before activating the power source. In further embodiments the system waits a few milliseconds for the switches to activate or deactivate.

After one pulse, the control electronic updates the count on each of the switches and confirms whether any change in switch configuration is required before the next voltage pulse. It may also receive confirmation whether the spines have moved. When the control electronics has determined that all switches are correctly configured it will initiate the next voltage pulse.

Figure 13:
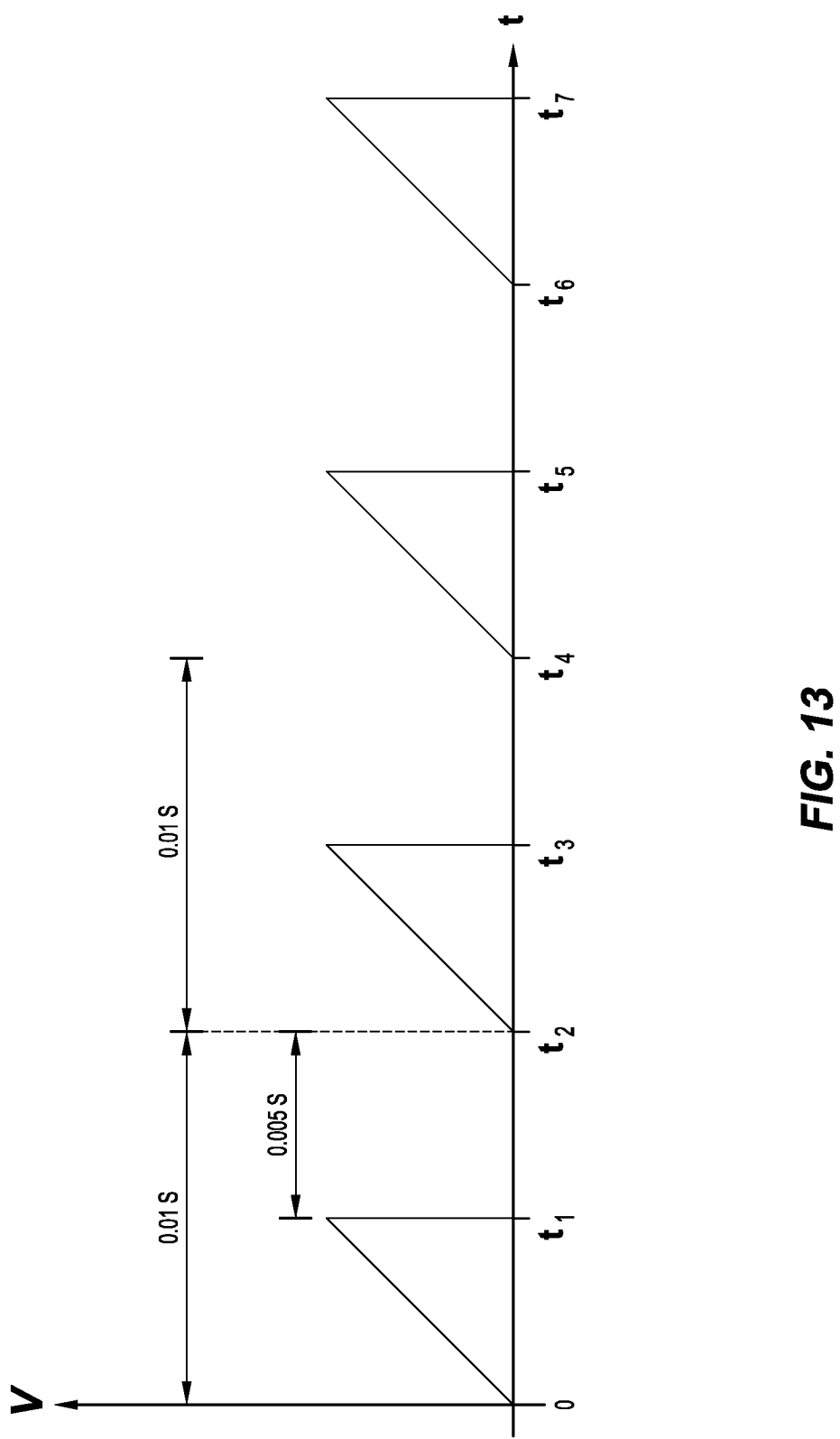
FIG. 13 is a representation of a sawtooth voltage applied to piezoelectric actuators in an embodiment.

When a change in switch configuration is required for a particular actuator the control electronics will instruct that change in configuration before the next voltage pulse. The system is typically operated at 100 Hz (0.01 seconds between voltage pulses), as shown in FIG. 13. The configuration decision via the control electronics is taken on a per pulse basis and the instruction to change configuration of all switches is provided in the time period at which the voltage from the power supply is zero. In the embodiment of FIG. 13, this time is of order 0.005 seconds. The control electronics is highly configured to operate in this time window.

Figure 14:
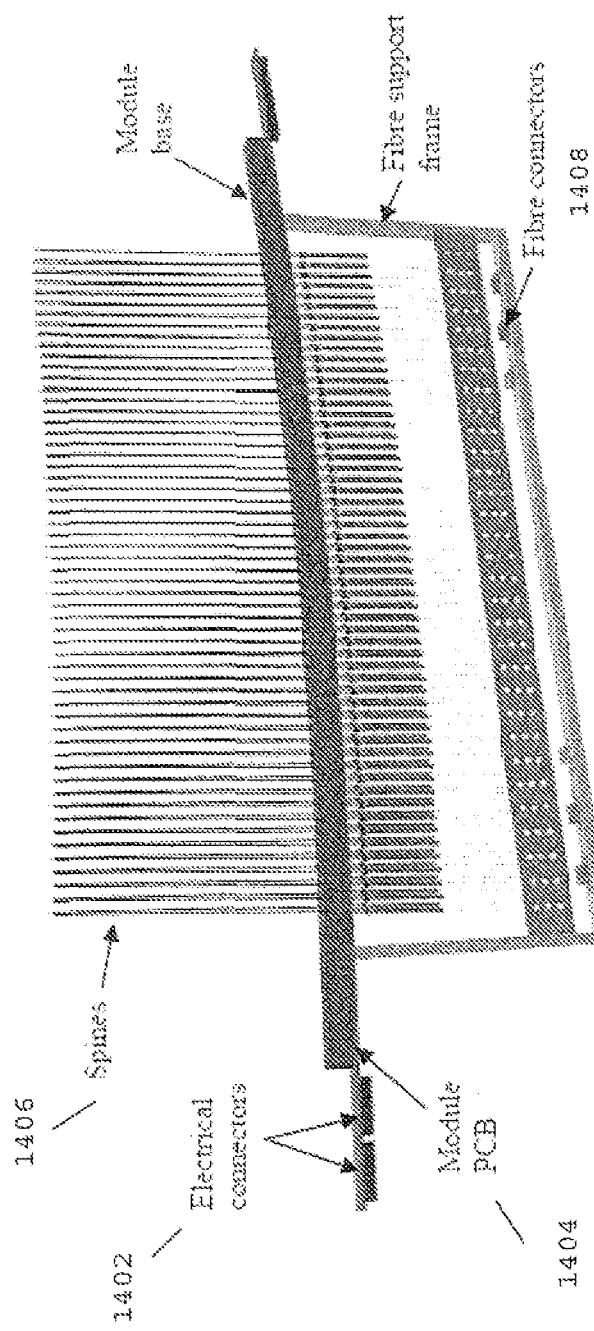
FIG. 14 is a representation of a spine assembly module containing 113 spines in two rows.

FIG. 14 is a representation of a module populated with 113 spine assemblies in two rows. The spines are mounted in modules to facilitate assembly and maintenance. In a large optical telescope, multiple modules will be installed side by side to create the fibre positioning system. FIG. 14 shows the electrical connections 1402 and the module printed circuit board 1404 which provides electrical connections to each of the spine assemblies 1406 via a series of switches. The light from the fibres is delivered to the spectrograph via the fibre connectors 1408. In order to provide as many optical fibres as possible within the physical confinements of the telescope, the spines are packed closely together. This packing configuration is shown in FIG. 15.

Figure 15:
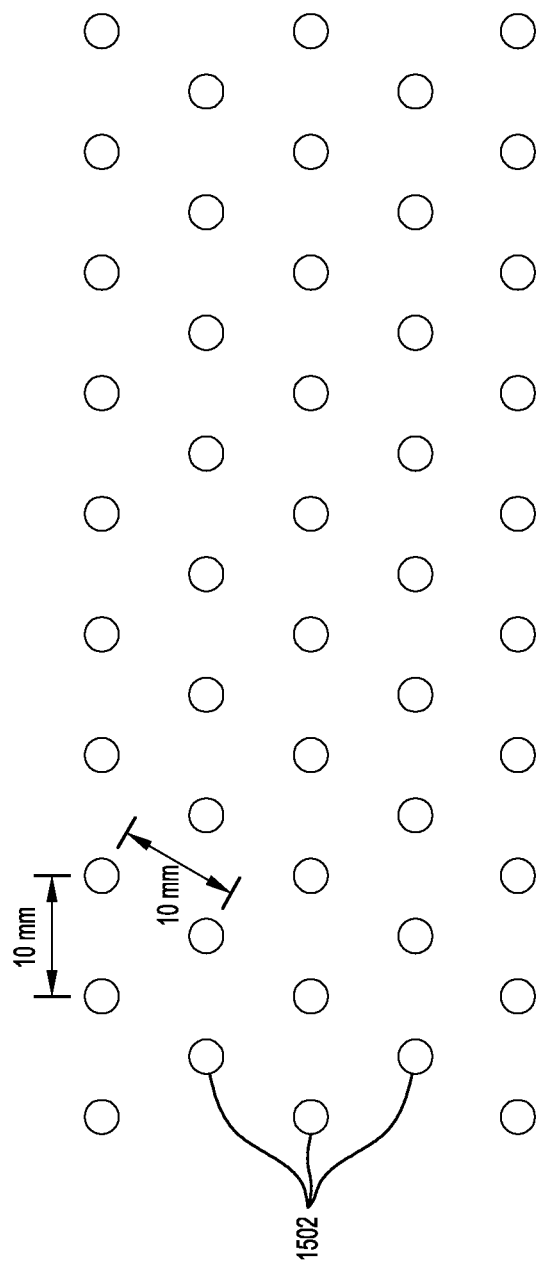
FIG. 15 is a cross sectional representation of a array of spine assemblies.

FIG. 15 shows a cross sectional view through a part of the array of actuators in the fibre positioning system. The spine assembly units are packed in a hexagonal configuration. In the embodiment each spine is separated by 10 mm and the actuators are equally spaced. The diameter of the pivoting balls is 8 mm. The very large number of spines and the close proximity of each spine assembly results in considerable magnetic flux across the array generated by the magnetic mount. The interaction of so many magnets within such a close proximity results in a complicated magnetic flux profile across the array. This can affect the magnetic coupling force between an individual pivoting ball and its associated magnetic mount if it is not managed carefully. It will be clear that other dimensions of the system are possible.

Figure 16:
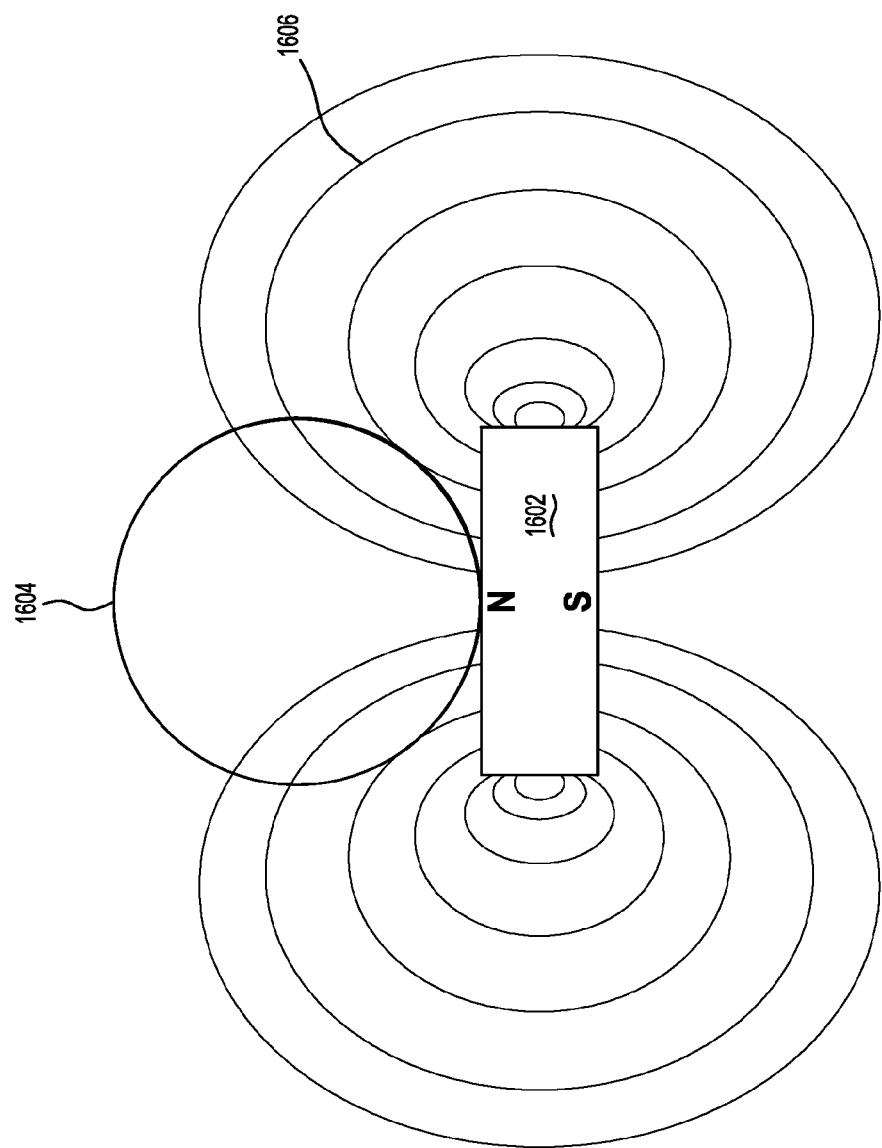
FIG. 16 shows the magnetic flux lines between a magnet and pivoting ball.

FIG. 16 shows the magnetic flux profile of an individual magnet with the pivoting ball. In the embodiment of FIG. 16, it is clear that the magnetic flux 1606 from the magnet 1602 escapes widely away from the magnet and the ball 1604. In a large fibre positioning system with many hundreds of magnet and pivoting ball assemblies, this flux pattern from this individual magnet will interact with that from the adjacent magnets.

Figure 17:
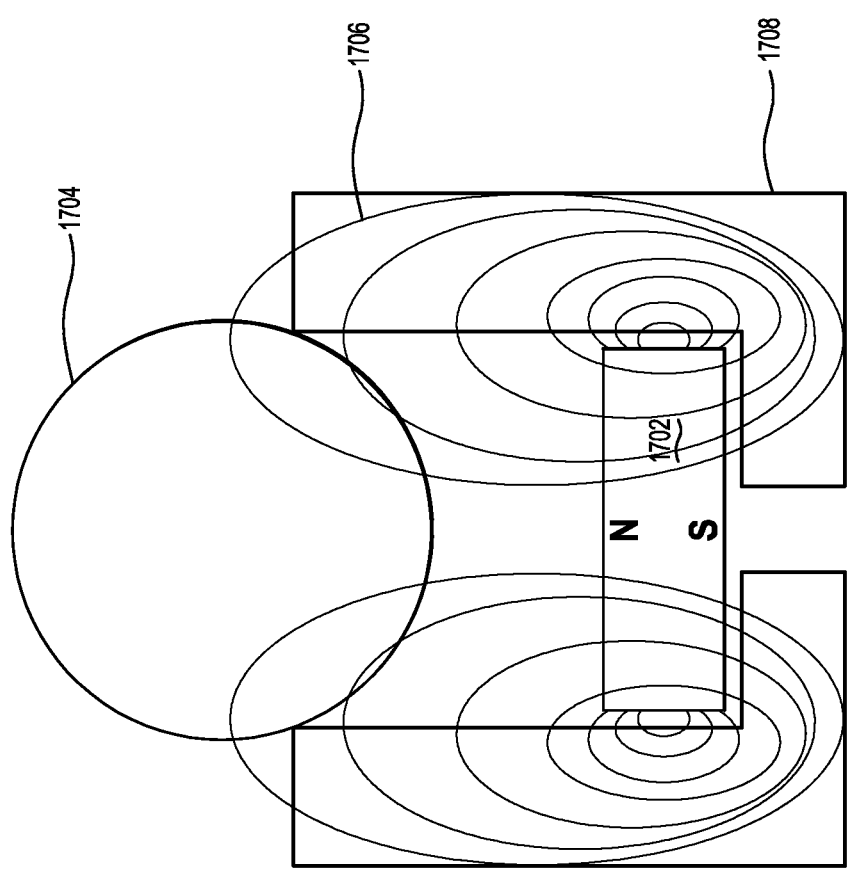
FIG. 17 shows the magnetic flux lines within a magnetic cup and pivoting ball.

FIG. 17 shows an embodiment of the mount assembly which uses a cup assembly 1708 around the magnet in order to guide the magnetic flux from the magnet 1702 to the pivoting ball 1704. The cup is made of a ferromagnetic material. This guides the flux lines 1706 between the magnet and the ball and limits the escape of flux from the proximity of the magnet and the ball. The flux lines to and from the bottom of the magnet are guided by the cup up 1708 to and from the ball 1704.

By using the cup to guide the flux, the magnetic influence of one mount assembly on an adjacent assembly is reduced and so the magnetic interference is reduced. This management of magnetic interference can help to maintain a consistent coupling interaction between the magnetic cup and the pivoting ball and improve reliability in the system.

It will be clear that further orientations and configuration of the magnets are possible.

Further embodiments of the invention use different mount assembly configurations to limit the magnetic interaction of one magnet and ball assembly on an adjacent magnet and ball assembly. In certain embodiments of the invention the walls of the mount are solid. In further embodiments the walls of the mount may be perforated or include slots or other complex forms.

FIG. 18 shows an alternative embodiment of the mount from two perspectives. FIG. 18a shows a cross sectional view and FIG. 18b shows a side view. In this embodiment the mount extends across the underside of the magnet 1802 and has three protruding arms 1804 to contact the pivoting ball.

In FIG. 19, the magnet 1902 is contained within cup 1904 which has perforated walls, demonstrated in FIG. 19b.

It will be clear to those skilled in the art that many different embodiments of cup can be envisaged which provide the functionality of limiting the escape of the magnetic flux lines from the magnet to the ball.

In embodiments of the invention the contact provided between the ball and cup is provided by the circumference of the mouth of the cup. In preferred embodiments of the invention the size of the cup is designed to retain the ball. The angle of contact is around 45° in order to provide maximum contact between the ball and the cup while provided a containment force in addition to the magnetic coupling attraction.

Figure 20:
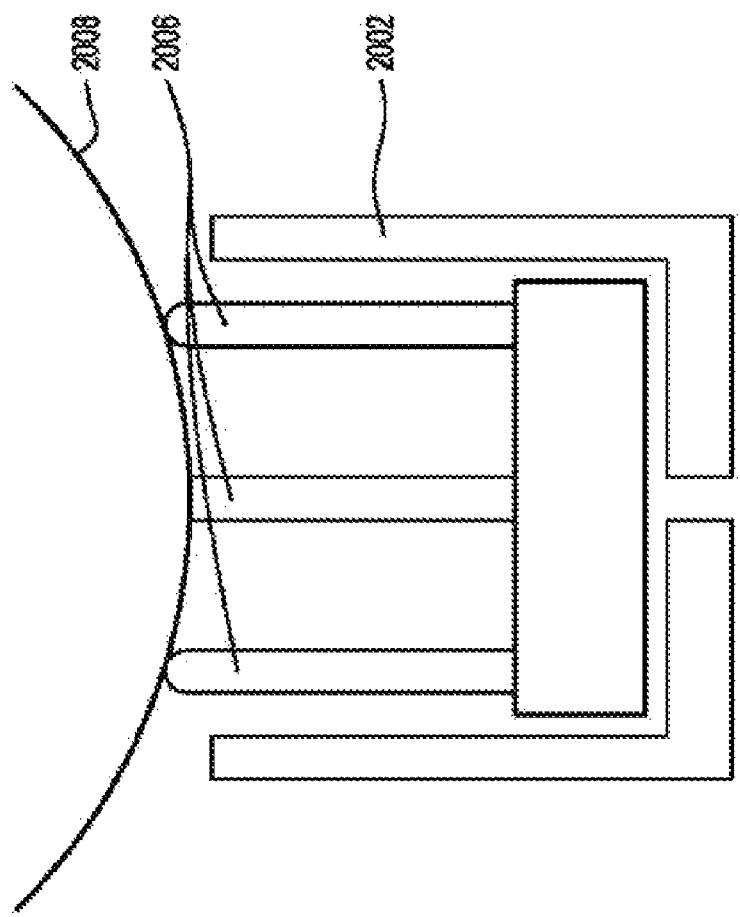
FIG. 20 shows a further mounting assembly.

In the mount of FIG. 20, the cup 2002 is provided simply as a magnetic flux containment means and does not physically contact the ball 2008. In this embodiment, three separate contact points 2006 are provided for contact between the magnetic coupling assembly and the ball 2008 on the inside of the cup.

Figure 21:
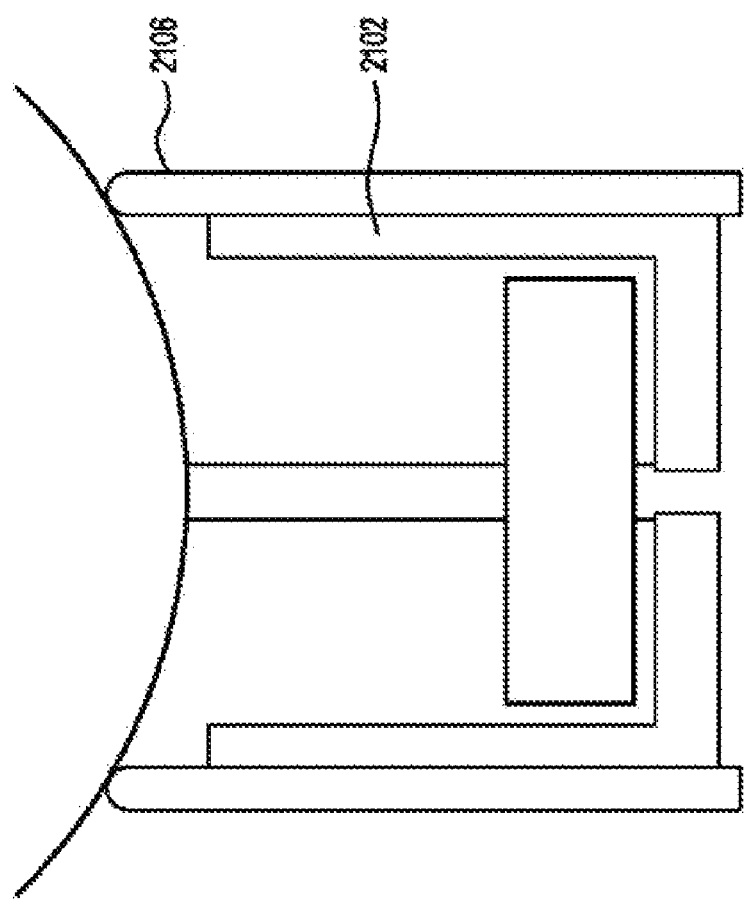
FIG. 21 shows a further mounting assembly.

FIG. 21 shows a further embodiment in which the supporting contact points 2106 are on the outside of the cups 2102. Again, the cup acts to limit the escape of flux.

Figure 22:
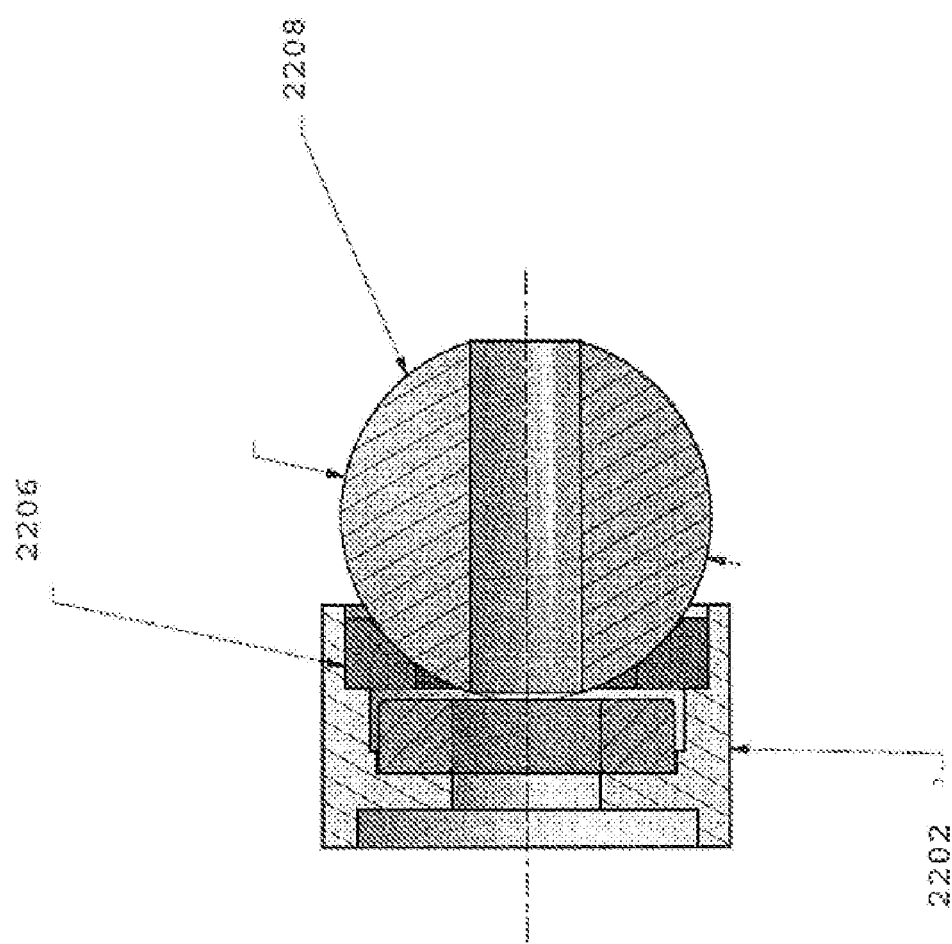
FIG. 22 shows a further mounting assembly.

FIG. 22 shows a further embodiment of the mounting assembly. In this embodiment the ball is mounted on a sapphire bearing 2206. The sapphire bearing is positioned within the steel cup 2202 and contacts the pivoting ball 2208. The sapphire bearing is non-ferrous and so will not interfere with the magnetic flux which is guided by the steel cup, as discussed in the embodiments above.

Preferably, the surface of the sapphire bearing is fitted to the curvature of the ball to enable the ball to rotate smoothly within the sapphire bearing. The high hardness and low wear resistance of the sapphire make it particularly useful since its performance should be maintained over time. The surface of the sapphire also has a low friction which allows efficient translation of the application force from the actuator and reduces losses in the system.

Other jewel materials having similar mechanical properties are suitable for use including ruby.

In embodiments of the invention, the operating frequency of the voltage pulses is matched to the resonant modes of the spine assembly. The frequency of the voltage pulses is selected to be one of the resonant modes of the tube supporting the optical fibre.

For example, if the tube naturally resonates at 300 Hz, then pulse frequencies of 100 Hz or 150 Hz provide predictable, repeatable movement since they are in-sync with the spine. The force from the actuator drives the bottom of the tube and the bending of the tube on impulse produces vibrations in the tube. By selecting a suitable frequency of driving pulses, the momentum of the tube does not work against the driving force.

In the case that the frequency of the pulses is not at a resonant mode of the tube, the momentum of the tube generated by the bending of the tube, could work against the driving force from the actuator. In such cases, the movement of the tubes would be inconsistent and unreliable.

The resonant modes of the tube are dependent on the dimensions of the tube as well as the mechanical properties of the tube and so suitable frequencies of the driving voltage depend on the characteristics of the tube.

The selection of material for use in the tubes is an important consideration in the performance of the system. Longer spines provide reduced optical loss in the system due to good alignment with the angle of incidence of the incoming light from the sources and the ability to use a fast pulse rate to the actuators is beneficial in order to provide short repositioning times. These factors tend to work against each other since, for a particular material, longer length (for a given diameter) reduces the resonant frequency of the tube and so careful material selection is required to provide good performance in the system. Another factor in design of the system is the inertia of the tubes since lighterweight tubes will respond more quickly to impulses from the actuators and will make counterbalancing more manageable in the system.

The pultruded carbon fibre used in the embodiment mentioned above has a relatively high resonant frequency for its length due its high stiffness (Young's modulus divided by density). This facilitates the use of suitably high pulse voltage of order 100 Hz. High pulse speed is beneficial since more impulses can be applied to the tubes per second which provides a faster time to reposition the tubes. This high stiffness also enables the tubes to be made longer for a given diameter, which helps decrease the optical losses in the system.

The lightweight nature of the pultruded carbon fibre also helps to keep the moment of inertia low which helps to reposition the optical fibre quickly and also leads to lower momentum.

In embodiments of the invention the stiffness of the pultruded carbon fibre tube was improved by increasing the ratio of carbon to epoxy resin during the manufacture process.

It will be clear to those skilled in the art that many further embodiments of the invention are possible, in particular different configurations of the mount.

The invention claimed is:

1. An optical telescope fibre positioning system, comprising:
   a mounting assembly including a piezo electric actuator and at least one electrode for applying an electric potential to the piezo electric actuator, the electric potential distorting the actuator; and
   a positioning device for positioning an optical fibre, the positioning device being magnetically coupled to the mounting assembly, the positioning system is configured to limit the spread of magnetic flux; wherein application of electric potential to the piezo electric actuator generates distortion of the piezo electric actuator which produces movement of the positioning device via the magnetic coupling.

2. The optical telescope fibre positioning system of claim 1 wherein the mounting assembly further includes a magnetic flux guide including a magnet, the magnetic flux guide being configured to guide the magnetic flux between the magnet and the positioning device.

3. The optical telescope fibre positioning system of claim 2, wherein the magnetic flux guide is of ferrous material.

4. The optical telescope fibre positing system of claim 1 wherein the magnetic flux guide is cup shaped.

5. The optical telescope fibre positioning system of claim 1 wherein, in use, the magnetic flux guide is in contact with the positioning device.

6. The optical telescope fibre positioning system of claim 1 wherein the mounting assembly further includes a support structure for contacting the positioning device.

7. The optical telescope fibre positioning system of claim 6 wherein the support structure is a jewel bearing.

8. The optical telescope fibre positioning system of claim 6 wherein the support structure includes multiple contact elements.

9. The optical telescope fibre positioning system of claim 1, further comprising an optical fibre support tube, the positioning device being moved at regular time intervals and wherein the frequency of movement of the positioning device matches a resonant frequency of optical fibre support tube.

10. A sensor array for an optical telescope comprising a plurality of the optical telescope fibre positioning systems of claim 1 wherein the positioning devices are configured adjacent to one another and the magnetic flux of each device is limited to limit interference with adjacent devices.

11. A tube for supporting an optical fibre in the optical telescope fibre positioning system of claim 1, wherein the tube is comprised of a pultruded carbon fibre tube.

12. The tube according to claim 11 wherein the pultruded carbon fibre has high modulus.

13. The optical telescope fibre optic positioning system of claim 1, the system being configured such that the piezo electric actuator returns to an undistorted configuration on removal of the electric potential.

14. The optical telescope fibre optic positioning system of claim 13, wherein the positioning device is configured to slip with respect to the mounting assembly upon removal of the electric potential to retain the position of the positioning device.

* * * * *